(12) United States Patent
Kaidi et al.

(10) Patent No.: US 11,639,557 B2
(45) Date of Patent: May 2, 2023

(54) COMPOSITE COPPER FOIL AND METHOD OF FABRICATING THE SAME

(71) Applicant: Circuit Foil Luxembourg, Wiltz (LU)

(72) Inventors: Zainhia Kaidi, Wiltz (LU); Thomas Devahif, Wiltz (LU); Adrien Kersten, Wiltz (LU); Michel Streel, Wiltz (LU)

(73) Assignee: Circuit Foil Luxembourg, Wiltz (LU)

( * ) Notice: Subject to any disclaimer, the term of this patent is extended or adjusted under 35 U.S.C. 154(b) by 0 days.

(21) Appl. No.: 17/434,943

(22) PCT Filed: Feb. 28, 2019

(86) PCT No.: PCT/EP2019/055055
§ 371 (c)(1),
(2) Date: Aug. 30, 2021

(87) PCT Pub. No.: WO2020/173574
PCT Pub. Date: Sep. 3, 2020

(65) Prior Publication Data
US 2022/0127743 A1   Apr. 28, 2022

(51) Int. Cl.
*C25D 5/12* (2006.01)
*C25D 7/06* (2006.01)
(Continued)

(52) U.S. Cl.
CPC ............... *C25D 5/12* (2013.01); *B32B 15/08* (2013.01); *C25D 7/0692* (2013.01); *H05K 1/09* (2013.01); *H05K 3/025* (2013.01); *B32B 2307/702* (2013.01); *B32B 2457/08* (2013.01); *C25D 3/562* (2013.01)

(58) Field of Classification Search
None
See application file for complete search history.

(56) References Cited

U.S. PATENT DOCUMENTS

| 4,675,246 A * | 6/1987 | Kundinger | B32B 27/12 428/394 |
| 2002/0004123 A1* | 1/2002 | Yamamoto | H05K 1/167 428/209 |

(Continued)

FOREIGN PATENT DOCUMENTS

| CN | 107475698 A | * 12/2017 | ............. C23C 18/50 |
| CN | 107475698 A | 12/2017 | |

(Continued)

OTHER PUBLICATIONS

Fan Jinping et al., "Electrochemical Properties of Pulse Plating Amorphous Ni—Mo—W Alloy Coating in Alkaline Medium", Rare Metal Materials and Engineering, Mar. 2015, vol. 44, Issue 3, pp. 538-543.

(Continued)

*Primary Examiner* — Seth Dumbris
(74) *Attorney, Agent, or Firm* — Sughrue Mion, PLLC

(57) ABSTRACT

A composite copper foil contains a carrier layer, a release layer and an ultra-thin copper layer in this order. In the composite copper foil, the release layer includes a binary alloy or a ternary alloy comprising nickel, and is formed into an amorphous layer, and the ultra-thin copper layer is peelable from the carrier layer. A method of fabricating the composite copper foil includes preparing a carrier layer, forming a release layer which is amorphous on the carrier layer by electroplating using an electrolyte that comprises nickel, and forming an ultra-thin copper layer on the release layer by electroplating.

17 Claims, 9 Drawing Sheets

(51) Int. Cl.
*H05K 1/09* (2006.01)
*H05K 3/02* (2006.01)
*B32B 15/08* (2006.01)
*C25D 3/56* (2006.01)

(56) References Cited

U.S. PATENT DOCUMENTS

| | | | | |
|---|---|---|---|---|
| 2002/0160222 | A1* | 10/2002 | Man | A44C 27/003 428/668 |
| 2007/0212566 | A1* | 9/2007 | Sato | C25D 7/06 428/629 |
| 2015/0156887 | A1* | 6/2015 | Cho | H05K 1/09 428/626 |

FOREIGN PATENT DOCUMENTS

| | | |
|---|---|---|
| CN | 105209252 B | 1/2018 |
| EP | 2615196 A1 | 7/2013 |
| JP | 07-292491 A | 11/1995 |
| JP | 11-269587 A | 10/1999 |
| JP | 2005-260058 A | 9/2005 |
| JP | 2007-186797 A | 7/2007 |
| JP | 2009-214308 A | 9/2009 |
| JP | 4612978 B2 | 1/2011 |
| JP | 2012-008065 A | 1/2012 |
| JP | WO2012/046804 A1 | 2/2014 |
| KR | 10-2013-0098359 A | 9/2013 |
| KR | 10-2014-0023744 A | 2/2014 |
| TW | I300380 B | 3/2006 |
| TW | I276708 B | 3/2007 |

OTHER PUBLICATIONS

International Search Report of PCT/EP2019/055055 dated Sep. 20, 2019 [PCT/ISA/210].

Written Opinion of PCT/EP2019/055055 dated Sep. 20, 2019 [PCT/ISA/237].

* cited by examiner

COMPOSITE COPPER FOIL AND METHOD OF FABRICATING THE SAME

CROSS REFERENCE TO RELATED APPLICATIONS

This application is a National Stage of International Application No. PCT/EP2019/055055, filed on Feb. 28, 2019.

TECHNICAL FIELD

Embodiments of the present invention relate to a composite copper foil and a method of fabricating the composite copper foil, and more particularly, to a composite copper foil that includes an amorphous alloy release layer and to a method of fabricating the composite copper foil.

BACKGROUND ART

Recently, with the miniaturization of electronic devices, an ultra-thin copper that has a thickness of about 5 μm or less has been used as an electronic material for a printed circuit board. Such an ultra-thin copper is very thin, and thus is not easy to use. In order to address such an issue, a composite copper foil in which an ultra-thin copper is attached to a carrier (support) is being used.

An ultra-thin copper foil laminate may be formed by laminating a resin base onto an ultra-thin copper layer of such a composite copper foil through pressing and heating, and then peeling the carrier layer off. In such a case, a release layer exists between the carrier layer and the ultra-thin copper layer, and the ultra-thin copper layer may be peeled off using the release layer.

As the release layer, an organic release layer to which an organic material, e.g., benzotriazole, is applied has been used. However, since the organic material itself included in the organic release layer has low heat resistance, the organic material of the release layer is decomposed when it reaches a high temperature of about 300° C. in a subsequent treatment process, e.g., prepreg pressing and fine casting. When the organic release layer is decomposed as described above, the carrier layer and the ultra-thin copper layer may closely contact each other, that is, the peeling property may be weakened or in a worse case, the ultra-thin copper layer may not be easily peeled off from the carrier layer.

Recently, there are cases where the release layer includes metal oxide. Such a release layer has a grain boundary peculiar to the metal, and the grain boundary grows in a specific direction, such that fine irregularities are formed on the surface, thereby causing defects such as pinholes that may be generated in the ultra-thin copper layer.

In regard of this, a composite copper foil that includes a release layer composed of a Cu—Ni—Mo alloy is disclosed in Japanese Patent Laid-Open No. 4612978. However, it is still unsatisfactory in terms of defects such as pin holes that may be generated in the ultra-thin copper layer.

DISCLOSURE

Technical Problem

Aspects of embodiments of the present invention are directed to a composite copper foil including a carrier layer, a release layer and an ultra-thin copper layer that substantially hardly generates defects such as pinholes even in the process of peeling.

Aspects of embodiments of the present invention are directed to a printed circuit board including the composite copper foil, and an electronic device using the printed circuit board.

In addition, aspects of embodiments of the present invention are directed to a method of fabricating the composite copper foil that includes preparing a carrier layer; forming a release layer which is amorphous on the carrier layer by electroplating using an electrolyte that includes nickel; and forming an ultra-thin copper layer on the release layer by electroplating.

Technical Solution

One embodiment of the present invention provides a composite copper foil comprising a carrier layer, a release layer and an ultra-thin copper layer in this order, wherein the release layer comprises a binary alloy or a ternary alloy comprising nickel, and is formed into an amorphous layer, and the ultra-thin copper layer is peelable from the carrier layer.

Another embodiment of the present invention provides a printed circuit board comprising the composite copper foil, and another embodiment provides an electronic device using the printed circuit board.

In addition, another embodiment provides a method of fabricating the composite copper foil, the method comprising: preparing a carrier layer; forming a release layer which is amorphous on the carrier layer by electroplating using an electrolyte that comprises nickel; and forming an ultra-thin copper layer on the release layer by electroplating.

Advantageous Effects

According to one or more embodiments of the present invention, it is possible to provide a composite copper foil that may not cause workability and quality problems because an increase in peel strength is small at high temperatures and a carrier layer may be easily peeled off from an ultra-thin copper layer.

MODE FOR INVENTION

As used herein, the term "composite copper foil" refers to a copper foil in which a carrier layer is attached to a copper foil layer, that is, a copper foil including a carrier layer, a release layer and a copper foil layer when the carrier layer is attached to the copper foil layer.

As used herein, the term 'amorphous' refers to a case where a broad diffraction peak appears when measured by Grazing Incidence X-ray Diffraction (GIXRD) or where a halo pattern appears at peaks when electron beam diffraction is measured by using a Transmission Electron Microscope (TEM).

Figure 1:
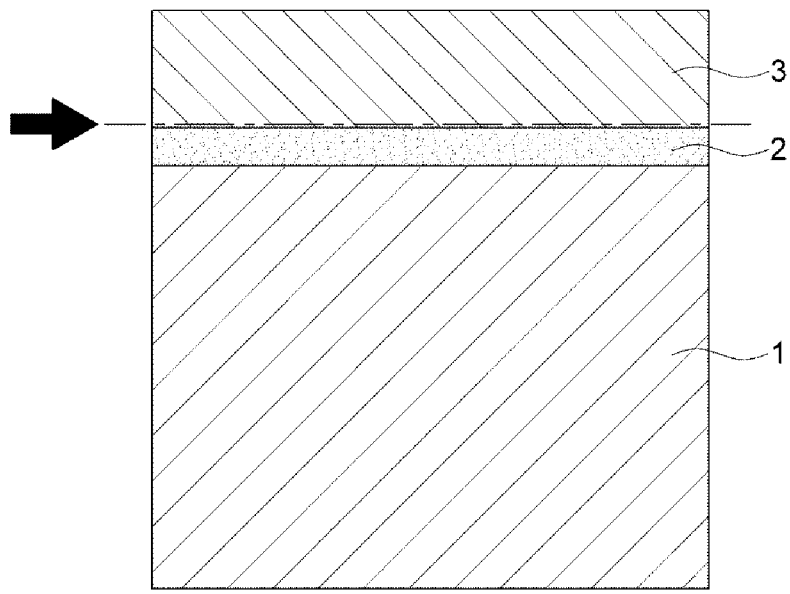
FIG. 1 is a cross-sectional view illustrating a composite copper foil according to an embodiment of the present invention.

FIG. 1 is a cross-sectional view illustrating a composite copper foil according to an embodiment of the present invention.

The composite copper foil includes a carrier layer 1, a release layer 2, and an ultra-thin copper layer 3 in this order. The release layer 2 includes a binary alloy or a ternary alloy including nickel and is formed into an amorphous layer. As indicated by the arrow in FIG. 1, the ultra-thin copper layer 3 may be peeled off from the carrier layer 1.

Hereinafter, each layer constituting the composite copper foil according to an embodiment of the present invention will be described.

Carrier layer According to an embodiment of the present invention, the carrier layer 1 is a support for supporting the ultra-thin copper layer 3. The carrier layer 1 serves as a reinforcing member or support for supporting the ultra-thin copper layer 3 until it is bonded to a substrate.

As the carrier layer 1, any of a shiny side (S-side) of an electrolytic copper foil and a matte side (M-side) subjected to smoothing treatment by etching and addition of an additive may be used.

A roughness of the carrier layer 1 depends on a degree (value) of an adhesion strength between the ultra-thin copper layer 3 and a resin substrate. For example, when the adhesion strength is required to be high, the roughness of the carrier layer 1 is preferably large. On the other hand, when it is necessary to form a fine circuit, the roughness of the carrier layer 1 is preferably small. In an embodiment of the present invention, a roughness Rz of the S side used for the carrier layer 1 is preferably 2.5 μm or less, more preferably 1.5 μm or less.

Although a thickness of the carrier layer 1 is not particularly limited, it is preferably in a range from 12 μm to 35 μm in consideration of cost, process, and characteristics.

Although a material of the carrier layer 1 is not particularly limited, a copper foil is preferable in consideration of cost, process, and characteristics.

Release Layer

The release layer 2 is a layer for allowing peeling to be carried out well when the ultra-thin copper layer 3 and the carrier layer 1 are detached from each other. Due to the release layer 2, the carrier layer 1 may be easily and neatly detached from the ultra-thin copper layer 3. The release layer 2 is detached from the ultra-thin copper layer 3 together with the carrier layer 1 when the carrier layer 1 is peeled off from the ultra-thin copper layer 3 and is removed.

The release layer 2 includes a binary alloy or a ternary alloy including nickel. It is preferable that a metal included in the alloy together with nickel includes at least one metal selected from the group consisting of molybdenum and tungsten.

In the case of the ternary alloy, it is preferable to use a ternary alloy of Ni—Mo—W. This is because materials that go in the induced co-deposition with nickel are molybdenum and tungsten.

In addition, it is preferable that the ternary alloy layer has a Ni content ranging from 1000 $\mu g/dm^2$ to 3000 $\mu g/dm^2$, a Mo content ranging from 300 $\mu g/dm^2$ to 1600 $\mu g/dm^2$, and a W content of 5 $\mu g/dm^2$ or more.

The release layer 2 is formed into an amorphous layer.

An amorphous alloy, also called a non-crystallizing alloy, refers to an alloy that has an irregular atomic structure such as liquid. Since the release layer 2 according to an embodiment of the present invention is amorphous, crystal growth with orientation in a specific direction is hardly achieved, and the release layer 2 includes little grain boundary. In addition, since the release layer 2 is amorphous, and it hardly has a crystal structure even when observed up to the molecular unit, it has higher rigidity and uniform surface as compared to a general metal material. That is, the release layer 2 has a smooth surface.

The release layer 2 that is amorphous may be formed by a conventional method such as a vapor deposition method, a sputtering method, and a plating method, but it is preferable to use a plating method. In particular, it is more preferable to use a wet plating method.

It is preferable that a ratio of an alloy including nickel is higher than a ratio of an oxide of the alloy on one surface of the release layer 2, and a ratio of an oxide of an alloy is higher than a ratio of the alloy on another surface of the release layer 2. It is preferable that the surface in which the ratio of the alloy including nickel is relatively high is in contact with the carrier layer 1, and the surface in which the ratio of the oxide of the alloy is relatively high is in contact with the ultra-thin copper layer 3.

That is, it is preferable that the ratio of the alloy is higher than the ratio of the oxide of the alloy on one of two surfaces of the release layer 2 that contacts the carrier layer 1, and that the ratio of the oxide of the alloy is higher than the ratio of the alloy on the other of the two surfaces of the release layer 2 that contacts the ultra-thin copper layer 3. In particular, it is preferable that the ratio of the oxide of the alloy is substantially constant within a range of about 3 nm to about 30 nm in a depth direction from the surface in contact with the ultra-thin copper layer. As used herein, the term "the ratio being substantially constant" does not only mean that the ratios are completely equal to each other but also includes a change within a range that cannot be considered as a significant change even if the ratio increases or decreases slightly. In an embodiment of the present invention, it includes a change within a range that cannot be considered as a significant change as the ratio increases or decreases within about 15% with respect to, for example, an average value. In addition, in a case where a thickness of the release layer is not less than a certain thickness (for example, about 29 nm), the ratio of the alloy decreases, but a ratio of copper may increase, from the certain thickness (for example, about 29 nm) toward the carrier layer 1, and there may be substantially no oxide from another certain depth (for example, 42 nm).

Meanwhile, since the release layer 2 is formed into an amorphous alloy layer, an oxide film formed on the release layer 2 also hardly has fine irregularities due to grain boundaries. Thus, even in the case of an oxide film, a smooth and dense surface may be formed. Accordingly, pinhole defects may be significantly reduced, and an ultra-thin copper foil having an excellent peeling property at high temperature may be formed.

In addition, a peel strength of the release layer 2 is preferably in a range from 5 gf/cm to 30 gf/cm, and more preferably, in a range from 10 gf/cm to 15 gf/cm. The peel strength of the surface of the release layer 2 in contact with the ultra-thin copper layer 3 may be controlled by controlling the ratio of the oxide.

A thickness of the release layer 2 may be adjusted by composition of an electrolyte and electrolytic conditions, and is preferably in a range from 5 nm to 50 nm, and more preferably, in a range from 25 nm to 35 nm.

The release layer 2 may be formed by electroplating and precipitation using an electrolyte that includes, for example, a nickel compound, a molybdenum compound, or/and a tungsten compound, with the carrier layer including metal serving as a negative electrode. Particularly, in such a case, induced co-deposition occurs due to the tungsten compound, and thus an amorphous layer may be formed.

In order to adjust a precipitation voltage of metal ions in the electrolyte, a complex may be added.

It is preferable to adjust a pH of an electrolytic bath to a range capable of forming an amorphous alloy layer during electroplating. The pH of the electrolytic bath may vary depending on the type of metal used as the alloy layer. For example, in a case where an alloy of nickel, molybdenum, and tungsten is used, it is preferable to adjust the pH of the electrolytic bath to a range from 2.5 to 4.5. This is because it is advantageous to form an amorphous alloy layer. When the pH of the electrolytic cell is less than 2.5, a crystalline alloy layer may be formed, and when the pH of the electrolytic cell is more than 4.5, only a thin film may be obtained since electroplating and precipitation are hard to be performed at such a pH.

The release layer 2 may be formed by performing electroplating once, but may be formed by repeating several times. If the electroplating is repeated several times, the peel strength may be more stable.

Ultra-Thin Copper Layer

According to an embodiment of the present invention, the ultra-thin copper layer 3 is peelable from the carrier layer 1 (i.e., is capable of being peeled from the carrier layer 1).

A thickness of the ultra-thin copper layer 3 is not particularly limited, but is preferably in a range from 0.5 to 10 μm, more preferably in a range from 1 to 9 μm. The thickness of the ultra-thin copper layer 3 may vary depending on a method of forming an ultra-thin layer. The thickness of the ultra-thin copper layer 3 is most preferably in a range from 2 μm to 5 μm irrespective of the method of forming an ultra-thin layer.

The method of forming the ultra-thin copper layer 3 is not particularly limited, but it is preferable to use an electrolyte that includes copper pyrophosphate or copper sulfate as a main component. In the case of using copper pyrophosphate as a main component, a dense copper plating layer may be formed, such that pinholes may be reduced. In the case of using copper sulfate as a main component, high-speed plating is possible and the ultra-thin copper layer 3 may be formed efficiently. When copper pyrophosphate and copper sulfate are used together, the ultra-thin copper layer 3 having less pinholes with a desired thickness may be efficiently formed.

Metal Layer

Figure 2:
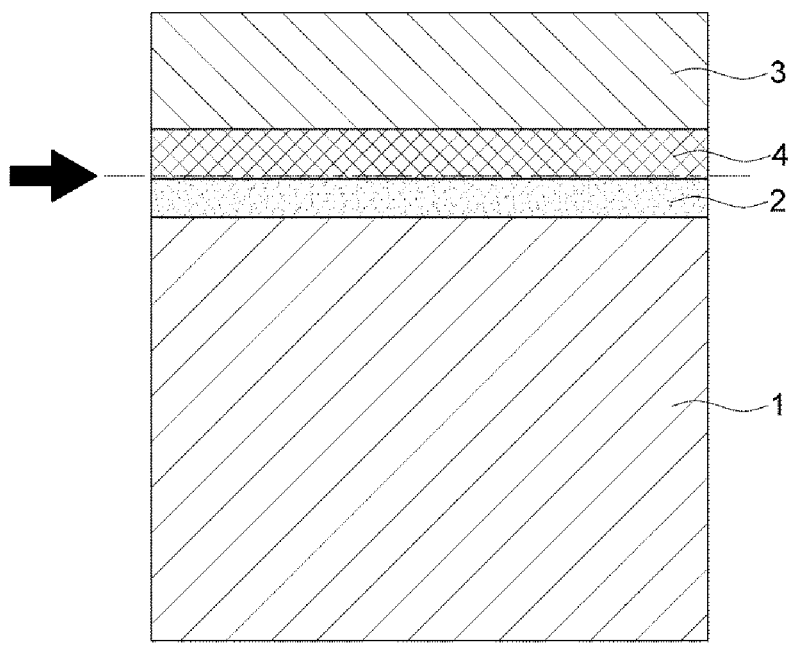
FIG. 2 is a cross-sectional view illustrating a composite copper foil according to another embodiment of the present invention.

As shown in FIG. 2, another embodiment of the present invention provides a composite copper foil that further comprises a metal layer 4 between the ultra-thin copper layer 3 and the release layer 2.

In the present embodiment, the metal layer 4 may be further included between the ultra-thin copper layer 3 and the release layer 2. The metal layer 4 may be also referred to as 'a laser drilling layer' because it is necessary for a subsequent laser drilling process. The metal layer 4 is used for heat-pressing the composite copper foil onto an insulating substrate and then stably peeling the composite copper foil off. The metal layer 4 is preferably a Ni layer or a Ni-alloy layer.

Herein, a content of Ni or Ni-alloy is preferably in a range from 100 μg/dm$^2$ to 1000 μg/dm$^2$, and more preferably in a range from 300 μg/dm$^2$ to 700 μg/dm$^2$. It is preferable that the Ni alloy layer includes P, S, or both of P and S. The metal layer 4 also serves to prevent copper (Cu) of the ultra-thin copper layer 3 from being exposed to the surface and diffused to the release layer 2 when a thermal press is applied.

The thickness of the metal layer is not particularly limited, but is preferably in a range from 5 nm to 10 nm.

It is preferable that the release layer and the metal layer are formed in a thickness ratio of 2.5:1 to 7:1, more preferably 3.5:1 to 5:1.

The metal layer 4 may also be formed into an amorphous layer. That is, in a case where the metal layer is a Ni—P layer or a Ni—S layer, an amorphous layer may be formed. When the metal layer 4 is formed into an amorphous layer, since the release layer 2 in contact with the metal layer 4 is also an amorphous layer, flattening effects may be substantially maximized due to the amorphous state. In other words, since two facing layers are each formed into a flat amorphous layer, the release layer 2 which is amorphous may be peeled off from the metal layer 4 which is amorphous much more easily when a portion indicated by the arrow in FIG. 2 is detached.

Roughened Layer

A roughened layer may be provided on a surface of the ultra-thin copper layer 3. The roughened layer may include at least one metal selected from the group consisting of copper, arsenic, and other organic additives. The roughened layer is formed so as to improve adhesion between the ultra-thin copper layer 3 and a resin layer.

On a surface of the ultra-thin copper layer 3 or the roughened layer, one or more layers selected from the group consisting of a heat resistant layer, an anticorrosive layer, a chromate-treated layer, and a silane-coupling-treated layer are provided. In a case where multi-layers are formed, it is preferable to form the ultra-thin copper layer 3, the roughened layer, the heat resistant layer or the anticorrosive layer, and the surface treat layer in this order.

Each of the heat resistant layer and the anticorrosive layer may include at least one metal selected from the group consisting of nickel, tin, cobalt, chromium, zinc and other organic additives, or an alloy thereof. It is preferable to use copper, or organic additive.

The surface treat layer may include at least one metal selected from the group consisting of nickel, tin, cobalt, chromium, and zinc, or an alloy thereof.

The chromate-treated layer is for corrosion inhibition treatment, and the silane-coupling-treated layer is for adhesion strengthening treatment.

Resin Layer

A resin layer may be provided on the ultra-thin copper layer 3 or the roughened layer.

An embodiment of the present invention provides a composite copper foil further comprising a resin substrate laminated on the ultra-thin layer. Herein, the resin substrate includes at least one of a polyimide-based resin, an epoxy-based resin, a maleimide-based resin, a triazine-based resin, a polyphenylene ether-based resin, and a polybutadiene-based resin. The polyimide-based resin may include, for example, polyimide, polyamideimide, and precursors thereof such as polyamide acid.

Another embodiment of the present invention provides a printed circuit board including the composite copper foil, and an electronic device using the printed circuit board. In order to manufacture the printed circuit board, for example, 1) a method of forming a copper clad laminate by laminating a resin layer and the ultra-thin copper layer 3 of the composite copper foil according to an embodiment of the present invention, and 2) a method of forming a copper clad resin film by applying a resin substrate solution on the ultra-thin copper layer 3 and heating it may be used. After peeling the carrier layer (support) 1 and the release layer 2 off from the copper clad laminate or the copper clad resin film formed in such a manner, the ultra-thin copper layer 3 may be etched to form a circuit, whereby a printed circuit board may be obtained.

In order to increase adhesion strength between the ultra-thin copper foil and a prepreg resin substrate and between the ultra-thin copper foil and a casting resin when forming the printed circuit board, precipitation may be carried out into a core acicular shape or a whisker shape by performing copper plating on a resin adhesive surface of the ultra-thin copper foil; and/or surface treatment may be performed with zinc or zinc alloy, chromate, and silane coupling agent in this order, as in the general copper foil surface treatment, thus forming the heat resistant layer or the anticorrosive layer.

Fabricating Method

The composite copper foil according to an embodiment of the present invention may be fabricated in a method that includes preparing a carrier layer 1; forming a release layer 2 on the carrier layer 1 by electroplating using an electrolyte that includes nickel, molybdenum, and tungsten; and forming an ultra-thin copper layer 3 on the release layer 2 by electroplating. Herein, it is preferable that after forming the release layer 2, a holding time during which the carrier layer 1 and the release layer 2 are left in the air is adjusted so that a peel strength is in a range from 5 gf/cm to 30 gf/cm, and more preferably in a range from 10 gf/cm to 15 gf/cm. In particular, it is preferable that the holding time is in a range from 10 seconds to 50 seconds, more preferably in a range from 30 seconds to 45 seconds, and most preferably in a range from 35 seconds to 40 seconds.

It is preferable but not invariably necessary that a surface of the carrier layer 1 is pretreated in preparing of the carrier layer 1. The pretreatment method is not particularly limited, and methods such as acid cleaning, alkali degreasing, and electrolytic cleaning are generally used. By this pretreatment, the carrier layer 1 having a clean surface may be prepared.

Forming of the release layer 2 is performed by electroplating the carrier layer 1 with an electrolyte that includes, for example, nickel, molybdenum, and tungsten.

A nickel compound, a molybdenum compound, and a tungsten compound may be used as nickel, molybdenum, and tungsten, respectively. For example, nickel sulfate hydrate may be used as the nickel compound; a molybdenum sodium or a hydrate thereof, e.g., molybdenum dihydrate, may be used as the molybdenum compound; and a tungsten or a hydrate thereof, e.g., tungsten dihydrate, may be used as the tungsten compound.

A solvent of the electrolyte is not particularly limited as long as it is a commonly used solvent, but water is generally used.

A concentration of the metal used in the electrolyte bath may be appropriately selected depending on the type of the metal. For example, in case that the amorphous alloy layer of Ni, Mo, and W is formed, it is preferable that a concentration of Ni is 9 g/L to 13 g/L, a concentration of Mo is 5 g/L to 9 g/L, and a concentration of W is 1 to 5 g/L.

A temperature of the electrolyte is generally in a range from 5° C. to 70° C., and preferably in a range from 10° C. to 50° C. A current density is generally in a range from 0.2 A/dm$^2$ to 10 A/dm$^2$, and preferably in a range from 0.5 A/dm$^2$ to 5 A/dm$^2$.

It is preferable that a pH is in a range from 2.5 to 4.5 for amorphous formation.

When the plating is performed under the above conditions, the metal is exposed to air, and an oxide is formed by oxidation of its surface.

In addition, after forming the release layer 2, and before forming the ultra-thin copper layer 3, plating a metal on the release layer 2 may be further included. The metal layer 4 formed by the plating is preferably a Ni or Ni-alloy layer. The metal layer 4 is as described above. The concentration of the metal used in the electrolytic bath, for forming the metal layer 4 may be appropriately selected depending on the type of the metal. For example, in case that the alloy layer of Ni—P is formed, a concentration of Ni in the electrolytic bath is preferably 3 g/L to 7 g/L, and a concentration of NaH$_2$PO$_2$ is preferably 4 g/L to 8 g/L. The pH is preferably in a range from 2 to 5, and more preferably in a range from 3 and 4.

Exemplary Embodiment 1

First, copper was acid cleaned, and then a carrier layer was formed using a copper foil. Electroplating was performed on the carrier layer by using an electrolyte that includes, for example, nickel (Ni), molybdenum (Mo), or/and tungsten (W), and thus an alloy release layer was formed. The electrolyte was prepared by adding nickel sulfate hydrate of 50 g, molybdenum sodium dihydrate of 20 g, and tungsten dihydrate of 5 g to water of 1000 ml. A temperature of the electrolyte was adjusted to 22° C., and a current density thereof was adjusted to 1 A/dm$^2$ to 2 A/dm$^2$. A pH was adjusted to 4 during electrolysis.

When the release layer which includes metal was exposed to air for 40 seconds by electroplating, its surface was oxidized to form an oxide.

Then, Ni—P was plated on the release layer 2, and thus a laser drilling layer was formed. In such a case, an electrolyte was prepared by adding nickel of 5 g and NaH$_2$PO$_2$ of 6 g to water of 1000 ml, and a pH was adjusted to 3.5 during electrolysis.

An ultra-thin copper layer was formed on the laser drilling layer by electroplating, and thus a composite copper foil was formed.

Comparative Example 1

A composite copper foil was prepared in the same method as in Exemplary Embodiment 1 except that the release layer was formed of a crystalline material of Ni—Mo and a pH is all adjusted to 2 during electrolysis.

Experimental Example 1

1. GIXRD Measurement

Figure 3:
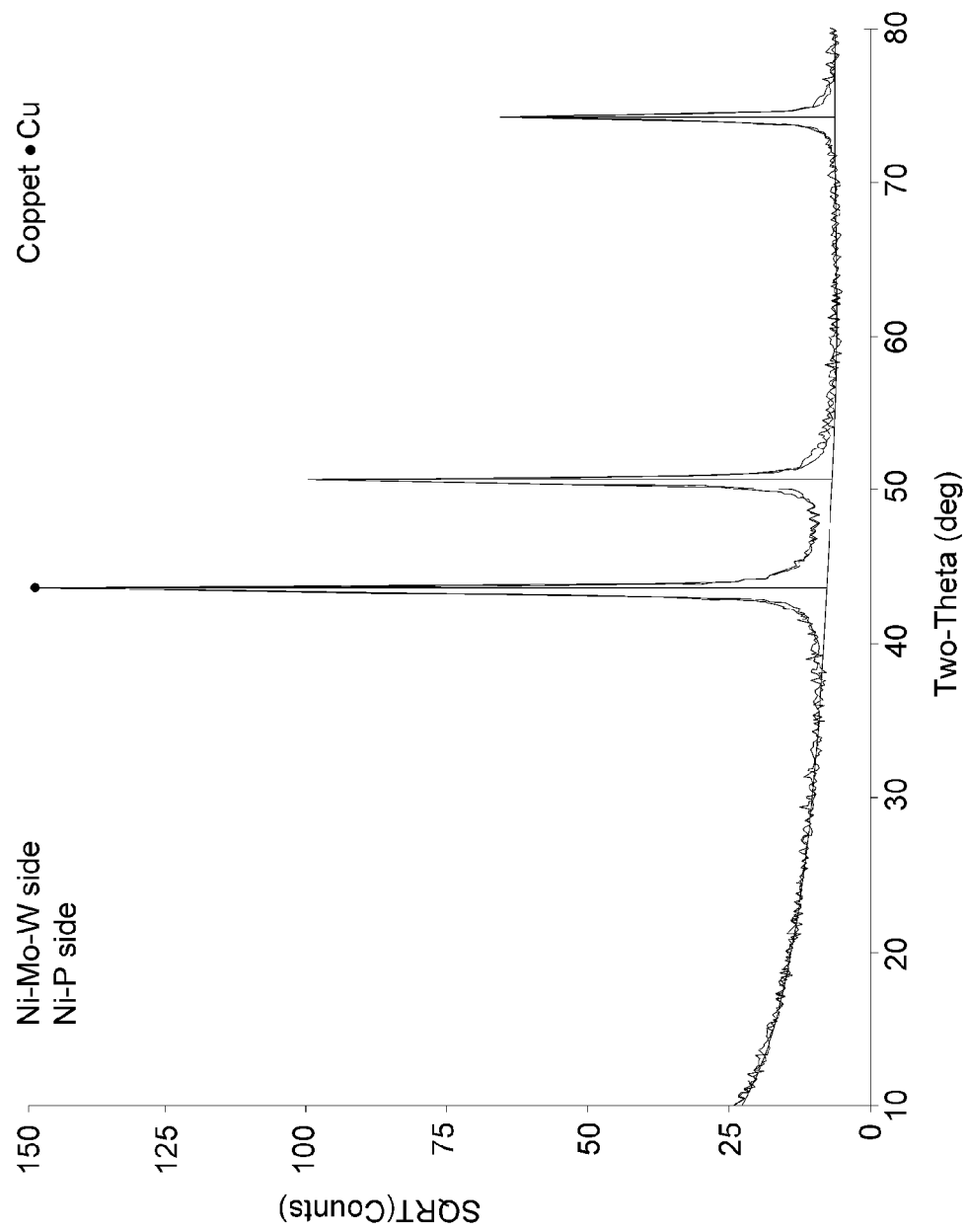
FIG. 3 is a GIXRD graph of a composite copper foil according to Exemplary Embodiment 1.

The composite copper foil according to Exemplary Embodiment 1 was thinly peeled, thus exposing the release layer (Ni—Mo—W layer) and the metal layer (Ni—P layer). The two surfaces were directly placed on a diffractometer, and GIXRD data was measured and collected, and the results are shown in FIG. 3. The incidence angle was fixed at 0.7 degrees.

FIG. 3 shows a comparison of the GIXRD data of the two samples and the best matching data between the background extracted raw data of the two samples and the ICDD/ICSD diffraction database. Weak peaks in the data are plotted on a square root intensity scale for emphasis and the reference pattern for copper is displayed. No diffraction peaks other than those corresponding to the copper foil were observed. The raised bases of the two most intense copper peaks may be due to broad peaks belonging to amorphous Ni—Mo—W and Ni—P layers.

2. TEM Measurement

Figure 4:
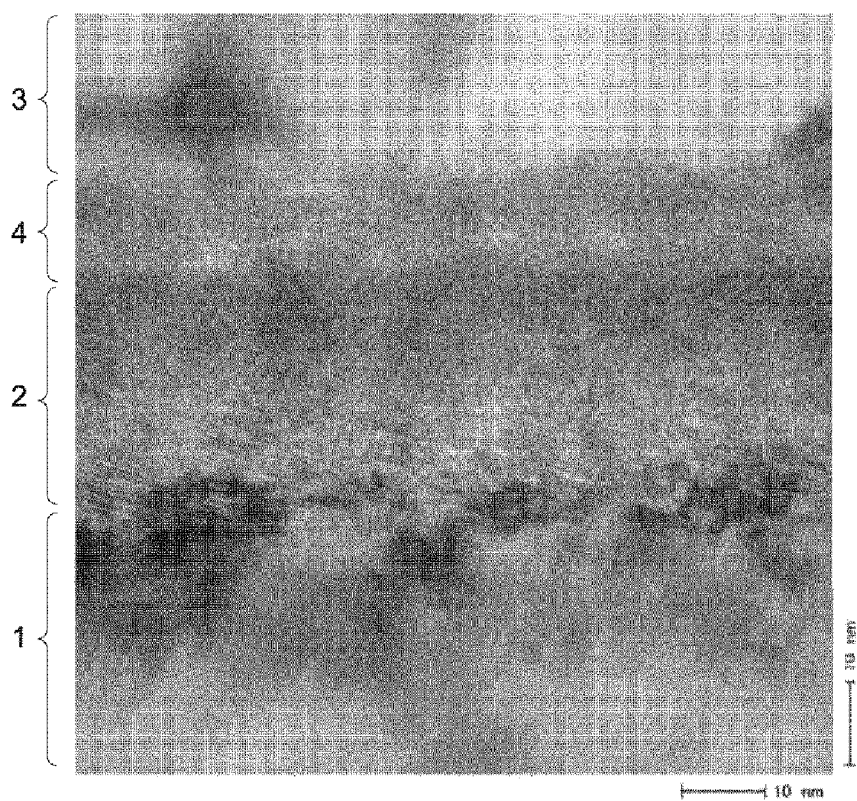
FIG. 4 is a TEM image of a composite copper foil according to Exemplary Embodiment 1.

The composite copper foil according to Exemplary Embodiment 1 was measured using a TEM having a beam diameter of 1 nm at 200 kV, and an image X2000000 thereof is shown in FIG. 4.

It can be appreciated from FIG. 4 that the ultra-thin copper layer 3, the metal layer 4, the release layer 2 and the carrier layer 1 were formed.

Figure 5:
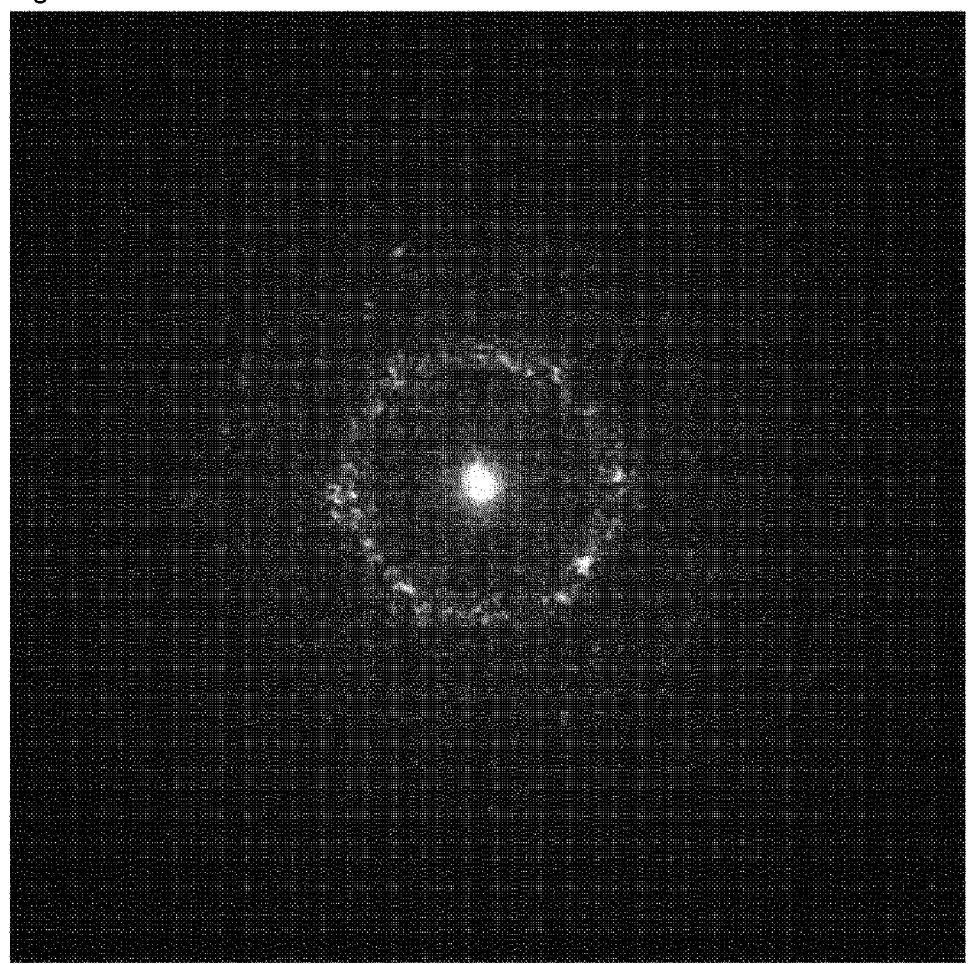
FIG. 5 is a view enlarging a metal layer of the composite copper foil shown in FIG. 4.

FIG. 5 is a view enlarging the metal layer 4 of the composite copper foil shown in FIG. 4. It can be appreciated from FIG. 5 that a halo pattern appears, whereby it can be confirmed that the metal layer was amorphous.

Figure 6:
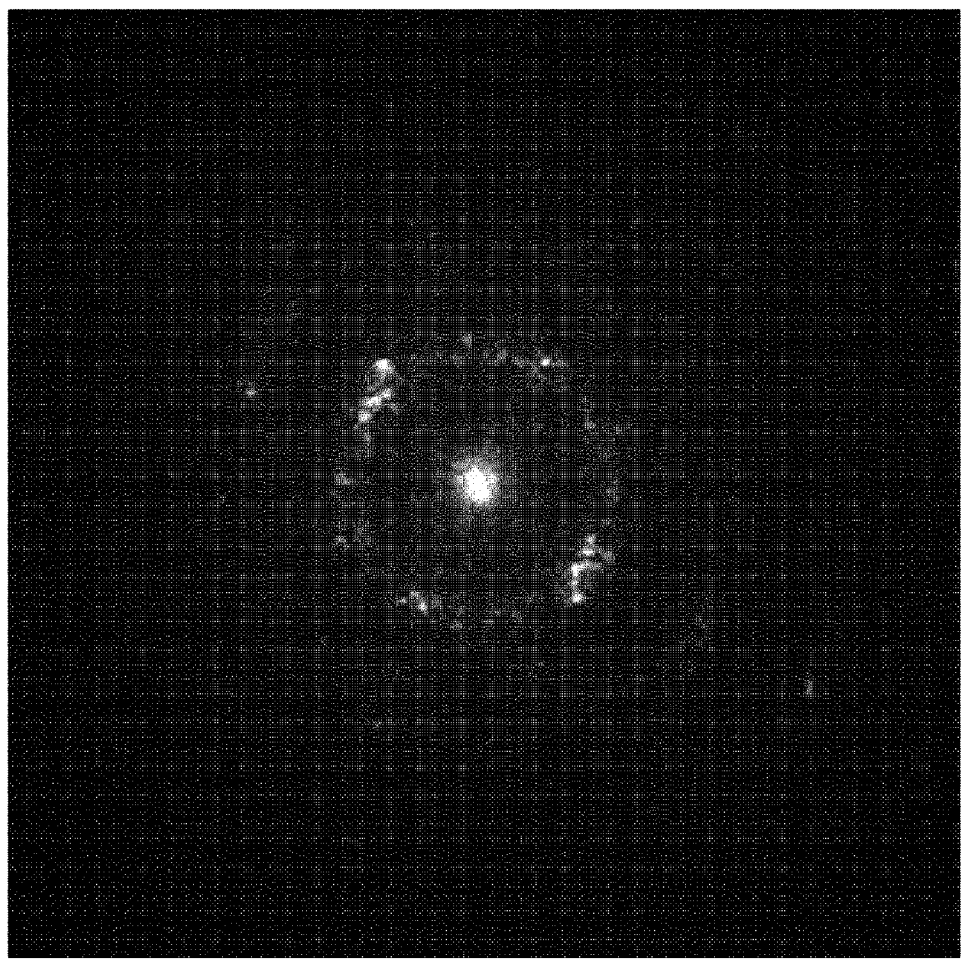
FIGS. 6 and 7 are views enlarging parts of a release layer of the composite copper foil shown in FIG. 4 that are close to the metal layer and the carrier layer, respectively.

FIG. 6 is a view enlarging a part of the release layer 2 of the composite copper foil shown in FIG. 4 that is close to the metal layer 4. Dispersed diffraction spots of an amorphous alloy are shown in FIG. 6.

Figure 7:
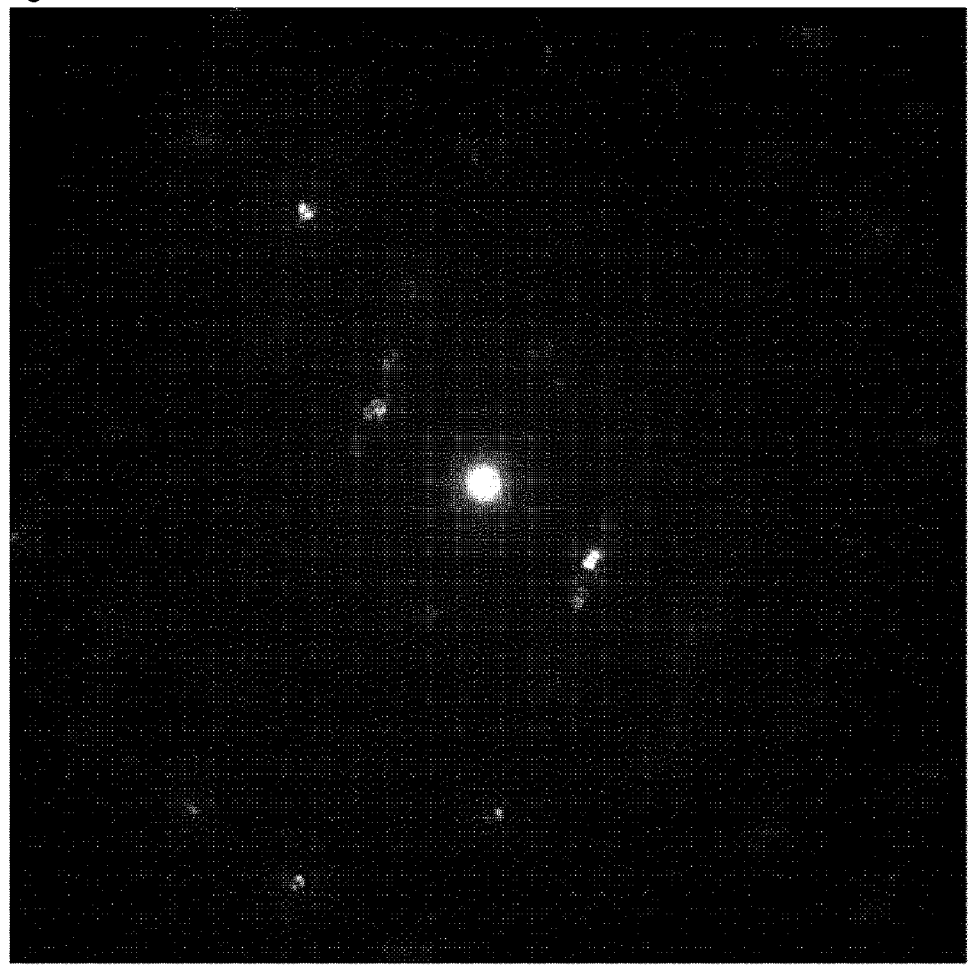

FIG. 7 is a view enlarging a part of the release layer 2 of the composite copper foil shown in FIG. 4 that is close to the carrier layer 1.

As described above, the release layer 2 on the carrier layer 1 was crystallized as a result of epitaxial growth under the influence of copper at an initial precipitation step (i.e., at an interface with the carrier layer 1), but it is confirmed that the release layer became amorphous as the plating grew.

Experimental Example 2

Respective ratios (atomic %) of Ni in the oxidation state were measured at a surface and at a depth of about 7 nm of the release layer of the composite copper foil according to Exemplary Embodiment 1 by X-ray photoelectron spectroscopy ("XPS") using an ultra-high vacuum K-alpha spectrometer (manufactured by Thermo (VG) Scientiffic) with a spot size of 400 μm at 75 W, and the results are shown in Table 1 below.

TABLE 1

|  | Ni(0) (wt % with respect to the total 100 wt % of nickel) | NiO (wt % with respect to the total 100 wt % of nickel) |
|---|---|---|
| Surface | 81.4 | 18.6 |
| About 7 nm Depth | 86.3 | 13.7 |

In addition, the profile of each element forming the release layer according to the depth of the composite copper foil according to Exemplary Embodiment 1 was measured and shown in the following Table 2, which is shown in a graph and shown in FIG. 8.

TABLE 2

| Length (nm) | C | Cu | Mo | Ni | O |
|---|---|---|---|---|---|
| 0.00 | 24.41 | 1.15 | 22.32 | 10.72 | 41.40 |
| 1.56 | 3.06 | 0.85 | 41.05 | 43.16 | 11.88 |
| 3.12 | 3.09 | 0.20 | 43.67 | 44.48 | 8.56 |
| 4.68 | 0.92 | 0.01 | 45.10 | 45.92 | 8.06 |
| 6.25 | 0.00 | 0.03 | 45.77 | 47.45 | 6.75 |
| 7.81 | 0.00 | 0.00 | 44.60 | 48.39 | 7.01 |
| 9.37 | 0.00 | 0.00 | 43.34 | 49.26 | 7.40 |
| 10.93 | 0.00 | 0.00 | 42.28 | 50.66 | 7.06 |
| 12.49 | 0.00 | 0.00 | 41.77 | 51.65 | 6.58 |
| 14.06 | 0.00 | 0.00 | 40.62 | 51.82 | 7.56 |
| 15.62 | 0.00 | 0.00 | 39.85 | 52.81 | 7.34 |
| 17.18 | 0.00 | 0.00 | 39.05 | 53.59 | 7.36 |
| 18.74 | 0.00 | 0.00 | 38.35 | 54.53 | 7.12 |
| 20.30 | 0.00 | 0.00 | 37.43 | 54.35 | 8.22 |
| 21.86 | 0.00 | 0.00 | 37.33 | 55.35 | 7.32 |
| 23.42 | 0.00 | 0.00 | 36.52 | 55.16 | 8.31 |
| 24.98 | 0.00 | 0.00 | 36.39 | 55.73 | 7.88 |
| 26.54 | 0.00 | 0.25 | 35.72 | 56.12 | 7.92 |
| 28.10 | 0.00 | 1.73 | 35.46 | 55.60 | 7.20 |
| 29.67 | 0.00 | 6.24 | 34.39 | 53.04 | 6.33 |
| 31.23 | 0.00 | 14.34 | 32.06 | 48.76 | 4.84 |
| 32.79 | 0.00 | 24.70 | 28.98 | 42.17 | 4.15 |
| 34.35 | 0.00 | 35.22 | 25.97 | 36.50 | 2.31 |
| 35.91 | 0.00 | 44.30 | 22.87 | 31.40 | 1.43 |
| 37.47 | 0.00 | 51.68 | 19.99 | 27.10 | 1.23 |
| 39.03 | 0.00 | 58.22 | 18.15 | 23.55 | 0.08 |
| 40.59 | 0.00 | 63.47 | 15.53 | 20.56 | 0.44 |
| 42.15 | 0.00 | 67.24 | 14.18 | 18.59 | 0.00 |
| 43.71 | 0.00 | 71.21 | 12.49 | 16.30 | 0.00 |
| 45.27 | 0.00 | 73.52 | 11.61 | 14.64 | 0.24 |
| 46.83 | 0.00 | 76.20 | 10.43 | 13.37 | 0.00 |
| 48.39 | 0.00 | 78.35 | 9.41 | 12.24 | 0.00 |
| 49.95 | 0.00 | 79.87 | 8.95 | 11.17 | 0.00 |
| 51.51 | 0.00 | 81.69 | 8.06 | 10.24 | 0.00 |
| 53.07 | 0.00 | 82.89 | 7.40 | 9.71 | 0.00 |

* the units of C, Cu, Mo, Ni and O are atomic %.
* The quantification of W was not possible because of interferences with peak of Mo.

Figure 8:
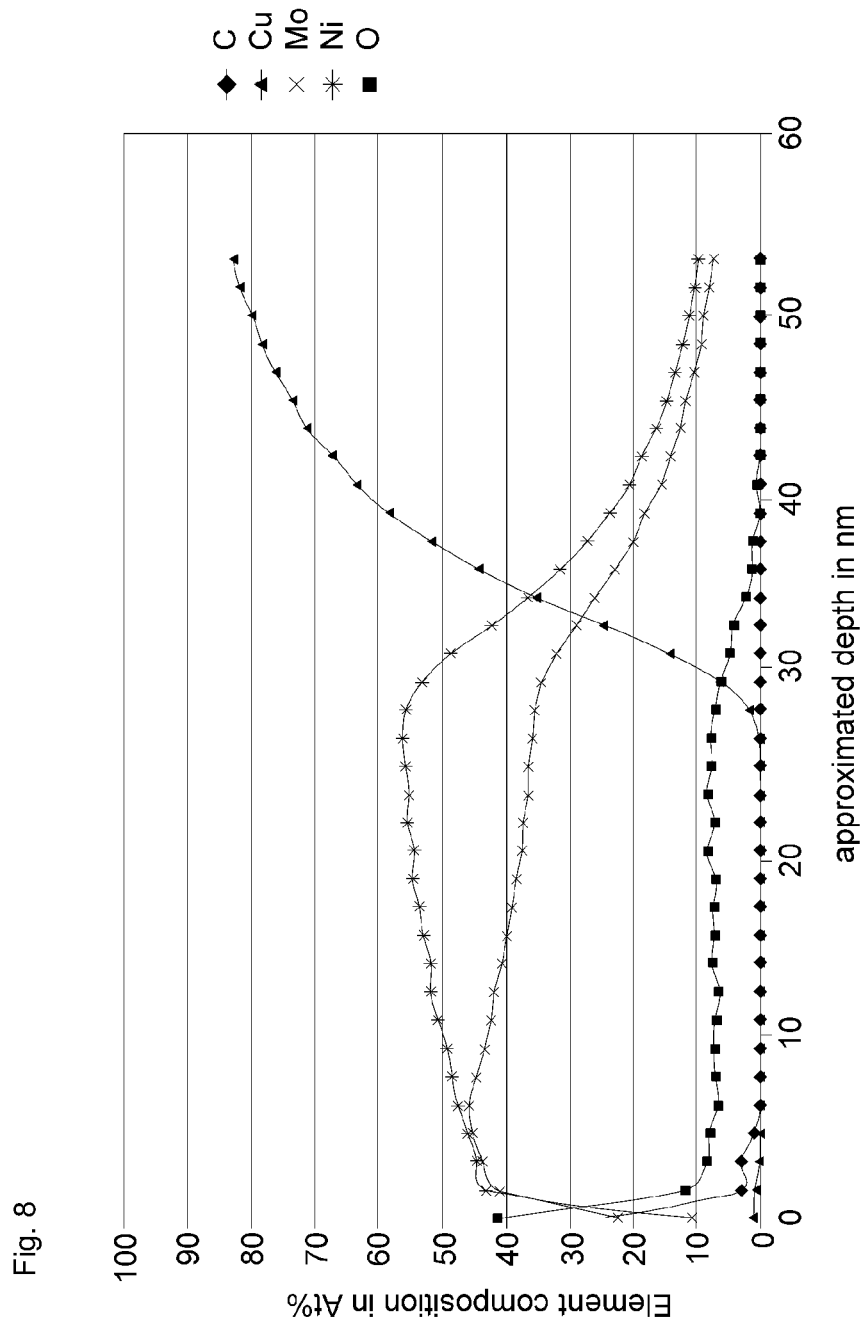
FIG. 8 shows a XPS profile of the releasing layer of the composite copper foil according to Exemplary Embodiment 1.

As shown in FIG. 8, the ratio of oxygen was found to be almost constant from a depth of about 3 nm from the surface or the interface. Up to a depth of about 30 nm, the ratio of oxygen was almost constant, and thereafter, it gradually decreased, and there was substantially no oxygen from a depth of about 42 nm.

Figure 9:
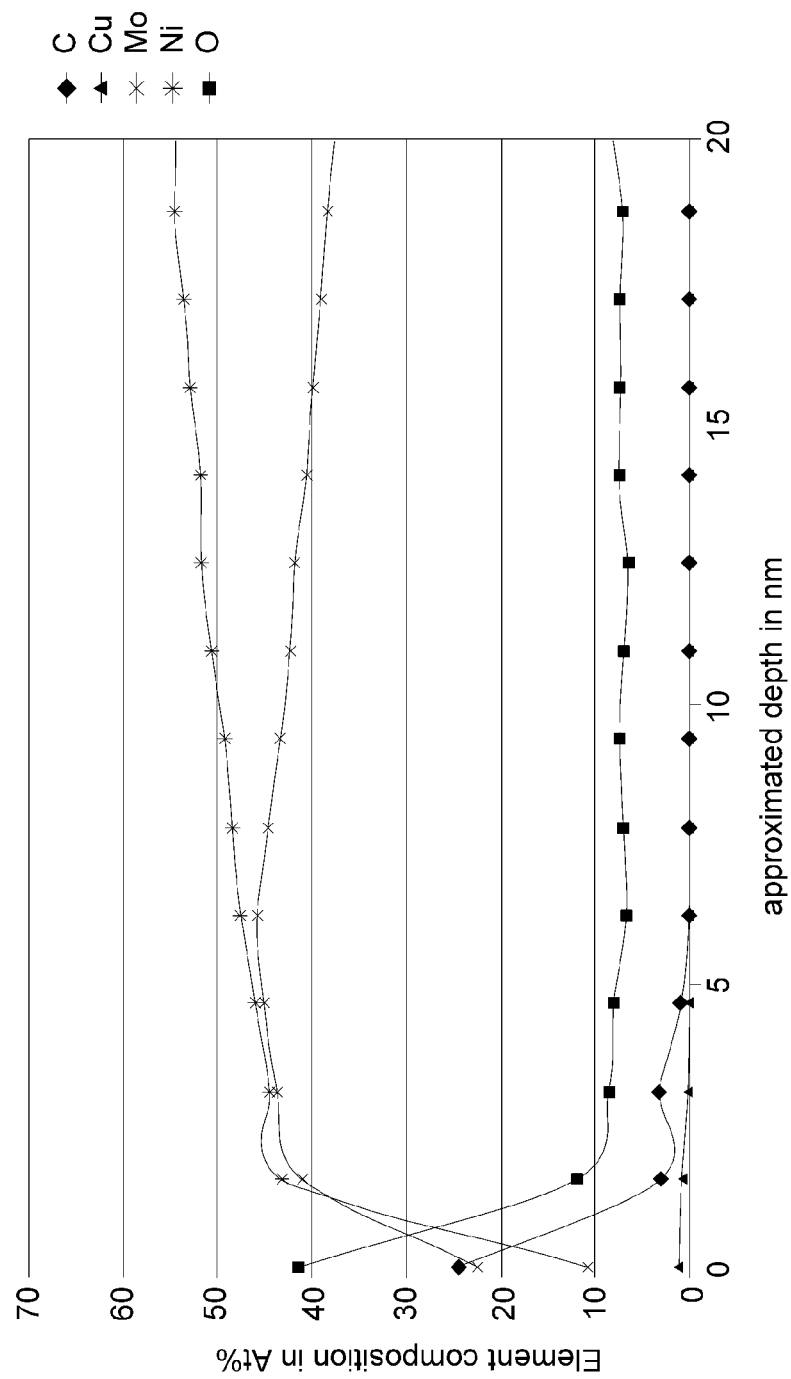
FIG. 9 shows a part of the XPS profile according to Exemplary Embodiment 1.

FIG. 9 enlarges the XPS profile according to the depth of the release layer of the composite copper foil according to Exemplary Embodiment 1, particularly, up to a depth of 20 nm. It can be appreciated from FIG. 9 that the ratio of oxygen is almost constant up to a depth of 20 nm.

Experimental Example 3

The composite copper foil of Exemplary Embodiment 1 and the composite copper foil of Comparative Example 1 were tested in terms of, for example, peel strength and lead heat resistance, and the results are shown in Table 3 below

TABLE 3

|  | Peel strength (kgf/cm2) | Lead heat resistance (sec) |
|---|---|---|
| Exemplary Embodiment 1 | 0.008 | 300 |
| Comparative Example 1 | 0.040 | 200 |

It was appreciated that the composite copper foil of Exemplary Embodiment 1 was excellent in peel strength and lead heat resistance, as compared to those of the composite copper foil of Comparative Example 1.

Experimental Example 4

Figure 10:
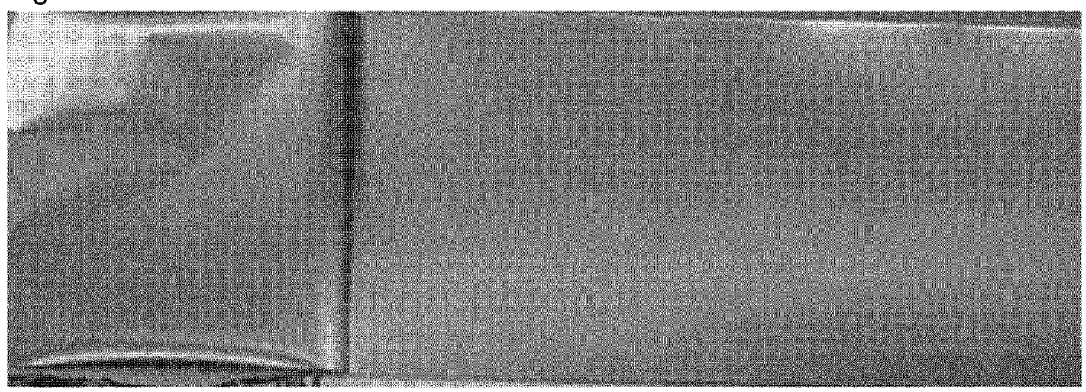
FIGS. 10 and 11 show images of surfaces of ultra-thin layers according to Exemplary Embodiment 1 and Comparative Example 1, respectively, after carrier layers are peeled off.
Figure 11:
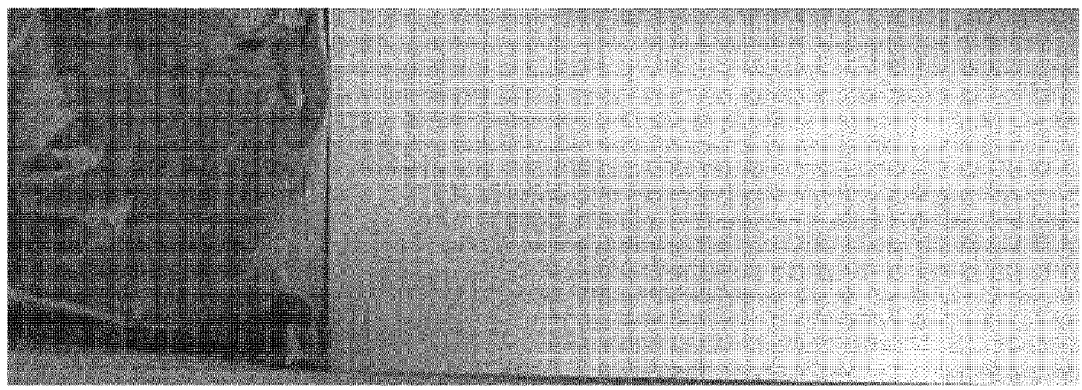

The composite copper foil of Exemplary Embodiment 1 and the composite copper foil of Comparative Example 1 were subjected to a crater test at 200° C. for 2 hours, and outer appearances of surfaces of the ultra-thin layers after peeling the carrier layers were compared, and the results are shown in Table 4 and FIGS. 10 and 11.

TABLE 4

| | Outer appearance of surface of ultra-thin layer after peeling |
|---|---|
| Composite copper foil of Exemplary Embodiment 1 | Good |
| Composite copper foil of Comparative Example 1 | Stripe marks |

As shown in Table 4, the composite copper foil of Exemplary Embodiment 1 showed good surface characteristics (see FIG. 10) of the ultra-thin layers where the ultra-thin layers were cleanly formed after peeling, whereas the composite copper foil of Comparative Example 1 exhibited stripe marks transferred on the ultra-thin layer (see FIG. 11). It may be assumed that components of the release layer smeared the ultra-thin layer because the peel strength is relatively low in FIG. 10, but the peel strength is relatively high in FIG. 11.

It will be appreciated that various embodiments and accompanying drawings in accordance with the present invention have been described herein for purposes of illustration. Accordingly, the various embodiments disclosed herein are not intended to be limiting of the true scope and spirit of the present teachings. Various features of the above described and other embodiments can be mixed and matched in any manner, to produce further embodiments consistent with the invention.

REFERENCE SIGNS LIST

1: Carrier layer
2: Release layer
3: Ultra-thin copper layer
4: Metal layer

The invention claimed is:

1. A composite copper foil comprising a carrier layer, a release layer and an ultra-thin copper layer in this order,
wherein the release layer comprises a ternary alloy comprising nickel, molybdenum and tungsten, and is an amorphous layer, and
the ultra-thin copper layer is peelable from the carrier layer,
wherein the release layer shows a broad pattern in terms of a diffraction peak when measured by grazing incidence X-ray diffraction, or shows a halo pattern in an electron beam diffraction pattern when measured by a transmission electron microscope.

2. The composite copper foil of claim 1, further comprising a metal layer between the ultra-thin copper layer and the release layer.

3. The composite copper foil of claim 2, wherein the metal layer is an amorphous layer.

4. The composite copper foil of claim 1, wherein a ratio of the ternary alloy comprising nickel, molybdenum and tungsten is higher than a ratio of an oxide of the ternary alloy on one surface of the release layer, and a ratio of an oxide of the ternary alloy is higher than a ratio of the ternary alloy on another surface of the release layer.

5. The composite copper foil of claim 4, wherein the ratio of the oxide of the ternary alloy is substantially constant within a range of about 3 nm to about 30 nm in a depth direction from a surface in contact with the ultra-thin copper layer.

6. The composite copper foil of claim 2, wherein the release layer and the metal layer are formed in a thickness ratio from 2.5:1 to 7:1.

7. The composite copper foil of claim 1, wherein the ternary alloy layer has a Ni content ranging from 1000 $\mu g/dm^2$ to 3000 $\mu g/dm^2$, a Mo content ranging from 300 $\mu g/dm^2$ to 1600 $\mu g/dm^2$, and a W content substantially equal to or more than 5 $\mu g/dm^2$.

8. The composite copper foil of claim 2, wherein the metal layer comprises nickel; nickel and phosphorus; nickel and sulfur; or nickel, phosphorus and sulfur.

9. The composite copper foil of claim 8, wherein a Ni or Ni-alloy content of the metal layer is in a range from about 100 $\mu g/dm^2$ to about 1000 $\mu g/dm^2$.

10. The composite copper foil of claim 1, further comprising a resin substrate laminated on the ultra-thin copper layer.

11. The composite copper foil of claim 10, wherein the resin substrate comprises one or more of a polyimide-based resin, an epoxy-based resin, a maleimide-based resin, a triazine-based resin, a polyphenylene ether-based resin, and a polybutadiene-based resin.

12. A printed circuit board comprising the composite copper foil of claim 1.

13. An electronic device using the printed circuit board of claim 12.

14. A method of fabricating the composite copper foil of claim 1, the method comprising:
preparing a carrier layer;
forming a release layer which is amorphous on the carrier layer by electroplating using an electrolyte that comprises nickel, molybdenum, and tungsten; and
forming an ultra-thin copper layer on the release layer by electroplating.

15. The method of claim 14, wherein forming of the ultra-thin copper layer is performed in a state where a pH of an electrolytic cell is in a range from about 2.5 to about 4.5.

16. The method of claim 14, wherein after forming the release layer,
the carrier layer and the release layer are left in the air (atmosphere) for 10 second to 50 seconds.

17. The method of claim 14, further comprising plating a metal on the release layer after forming the release layer, and before forming the ultra-thin copper layer.

* * * * *